US 8,259,486 B2

(12) United States Patent
Kumar et al.

(10) Patent No.: US 8,259,486 B2
(45) Date of Patent: Sep. 4, 2012

(54) SELF-TIMED WRITE BOOST FOR SRAM CELL WITH SELF MODE CONTROL

(75) Inventors: Ashish Kumar, Ranchi (IN); Naveen Batra, Bahadurgarh (IN)

(73) Assignee: STMicroelectronics International N.V., Amsterdam (NL)

( * ) Notice: Subject to any disclaimer, the term of this patent is extended or adjusted under 35 U.S.C. 154(b) by 122 days.

(21) Appl. No.: 12/571,170

(22) Filed: Sep. 30, 2009

(65) Prior Publication Data

US 2011/0026309 A1  Feb. 3, 2011

(30) Foreign Application Priority Data

Aug. 3, 2009 (IN) .......................... 1616/DEL/2009

(51) Int. Cl.
*G11C 11/00* (2006.01)
(52) U.S. Cl. ........ 365/154; 365/190; 365/156; 365/203; 365/189.11
(58) Field of Classification Search .................. 365/154, 365/156, 72, 190, 189.09, 189.11, 230.06, 365/230.05, 203
See application file for complete search history.

(56) References Cited

U.S. PATENT DOCUMENTS

| | | | | |
|---|---|---|---|---|
| 5,034,923 A * | 7/1991 | Kuo et al. | ................. | 365/189.16 |
| 5,189,641 A * | 2/1993 | Arakawa | ................. | 365/185.08 |
| 5,396,469 A | 3/1995 | Kushiyama | | |
| 6,222,757 B1 * | 4/2001 | Rau et al. | ................. | 365/154 |
| 7,313,032 B2 * | 12/2007 | Ellis et al. | ................. | 365/189.09 |
| 7,382,674 B2 * | 6/2008 | Hirabayashi | ................. | 365/226 |
| 7,619,947 B2 * | 11/2009 | Houston | ................. | 365/229 |
| 7,826,298 B2 * | 11/2010 | Nakai et al. | ................. | 365/229 |
| 2006/0171188 A1 | 8/2006 | Kawasumi | | |
| 2007/0206404 A1 * | 9/2007 | Yamagami | ................. | 365/154 |
| 2009/0027947 A1 * | 1/2009 | Takeda | ................. | 365/156 |

* cited by examiner

*Primary Examiner* — Hoai V Ho
*Assistant Examiner* — Kretelia Graham
(74) *Attorney, Agent, or Firm* — Hogan Lovells US LLP (57) ABSTRACT

A write boost circuit provides an automatic mode control for boost with different modalities with respect to the external supply voltage and also with respect to the extent of boost required at different process corners. The write boost circuit also takes care of the minimum boost provided to process corners with good writability where less boost is required. The boost is realized in terms of ground raising in the particular context and in general applicable to all other methods.

22 Claims, 7 Drawing Sheets

SELF-TIMED WRITE BOOST FOR SRAM CELL WITH SELF MODE CONTROL

RELATED APPLICATION

The present application claims priority of India Provisional Patent Application No. 1616/Del/2009 filed Aug. 3, 2009, which is incorporated herein in its entirety by this reference.

FIELD OF THE INVENTION

The present invention relates to SRAM cells, and more particularly, to a write boost circuit to improve the write performance of the SRAM cell.

BACKGROUND OF THE INVENTION

In deep submicron technology, worst process conditions and voltage scaling has created many problems in SRAM memories. Write failure in an SRAM memory cell is one critical problem caused due to the above reasons.

During a read operation, the pass transistor and the on NMOS driver act as voltage divider which raises the level of a zero stored in the memory cell. If the driver transistor resistance is comparable to the pass transistor resistance, then the raised internal node level can trip the memory cell in the opposite direction and thus the data will be corrupted. So for a non-destructive memory cell read, the pass transistors' resistance is made more than that of the driver transistors. This leads to further degrading of writability and the write time of the memory cell, because now a high voltage swing is required across BL/BLB for raising the level of the stored zero. This makes the writability issue even more of a concern at very low voltages.

Figure 1:
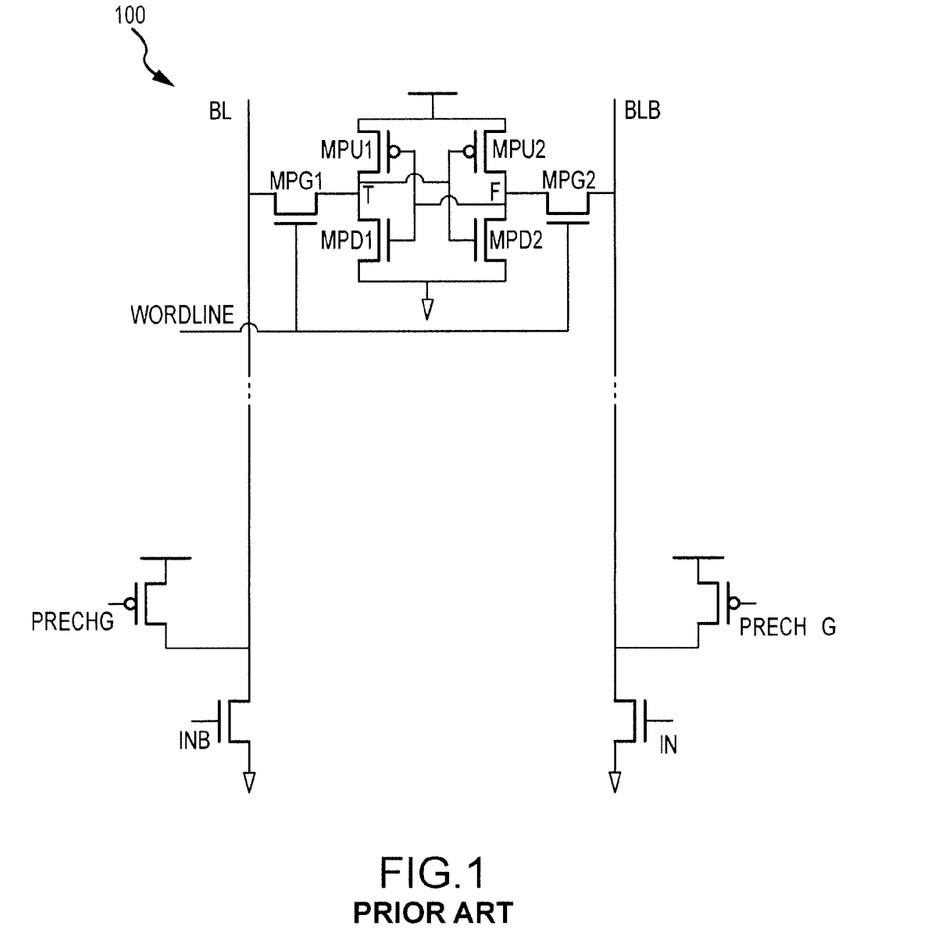
FIG. 1 is a schematic diagram of a prior art SRAM circuit.

Existing SRAM memory cells have extremely low voltage power supply requirements. Power supply requirements can range from 0.9 volts to 1.3 volts. At these low voltage levels, SRAM cell designs are tuned for ensuring margins but the writability of the memory cell is major problem. To make the SRAM memory cell writable at low voltages, write boost must be implemented. A write boost circuit is also required to address a process corner wherein NMOS transistors are slow and PMOS transistors are fast. To successfully cater to the above needs a new write boost circuit is required, which assures the writability at a particular process corner and in the low voltage power supply range in order to reduce boost power A conventional SRAM memory cell 100 is shown in which the basic six-transistor cell includes transistors MPG1, MPG2, MPU1, MPU2, MPD1, and MPD2. Transistor MPG1 is coupled to the bit line BL, and transistor MPG2 is coupled to the inverting bit line BLB. Transistors MPU1 and MPU2 are coupled to VDD through an upper power terminal, and transistors MPD1 and MPD2 are coupled to ground through a lower power terminal. As is known in the art, a P-channel precharge circuit and an N-channel input circuit are coupled to the bit lines BL and BLB.

In the conventional memory cell 100, there is word line WL, which activates the memory cell read/write operation through the gates of transistors MPG1 and MPG2. The precharge block is for precharging BL/BLB after a read/write operation, and the write driver NMOS transistor is used to pull down BL/BLB in a write operation. In/Inb are data inputs used to write a zero or one, depending on the data logic input.

Different prior art methods are known to improve writability at low voltages. Ground raising is one the them. Writability is a problem at a slow NMOS and fast PMOS process corner. Raising GND at other process corners only increases the boost power where write boost is not required. At high power supply voltage ranges the write boost is not required, which otherwise will increase the dynamic power as boost power will be extra power consumed. So to control write boost at low voltages external pins are used, which are manually controlled by the user.

A first known prior art technique is shown in U.S. Pat. No. 5,396,469. The advantages of this technique is that the GND level is raised during the write operation, and thus writability will improve. The disadvantages of this technique are that the GND of the complete row is raised, which reduces the signal to noise margin of unselected MUX columns of the same row. Also, GND is raised for both the NMOS drivers of a single memory cell (ON and OFF). This limits writability and write time to some extent as the off NMOS is now going to be on after the write operation is supplied with a raised GND.

A second known prior art technique is shown in US Publication No. 2006/0171188A1. The advantage of this technique is that VDD is lowered during the write operation, and thus writability will improve. The disadvantages are that the VDD lowering/cut off is implemented for both PMOS transistors simultaneously. This limits writability and write time to some extent as the off PMOS transistor, which is now going to be on after the write operation, is supplied with a lowered VDD voltage. If VDD is shared along the column then retention noise margin for memory cells in that same column will be reduced.

Write boost for SRAM is required in deep submicron technologies and also at low supply voltages in all technologies. This boost is required below a particular supply voltage of operation and also for a particular process corner. Presently used methods provide assists across all process corners with voltage dependent operation mode controlled externally. Thus, a need remains for a write boost circuit suitable for an SRAM that provides the desired extra performance required for low voltage and specific process corner operation, while addressing the problems associated with the prior art solutions.

SUMMARY OF THE INVENTION

According to the present invention, the write boost circuit provides an automatic mode control for boost with different modalities (with respect to the external supply voltage and also with respect to the extent of boost required at different process corners). The method of the present invention also takes care of the minimum boost provided to process corners with good writability where less boost is required. The boost is realized in terms of ground raising in the particular context and in general applicable to all other methods. A reduction of 50% to 75% in boost power at PVTs (i.e., process/supply voltage/temperatures) where boost is not required was observed. The self mode control with respect to supply voltage helps to gain in boost power 30% to 50%.

A first embodiment of a write boost circuit for an SRAM cell according to the present invention includes an input terminal for coupling to a power terminal of an SRAM cell; a diode coupled between the input terminal and ground; a first transistor coupled between the input terminal and a source of supply voltage; and a second transistor coupled between the input terminal and ground.

A second embodiment of a write boost circuit for an SRAM cell according to the present invention includes an input terminal for coupling to a power terminal of an SRAM cell; a diode coupled between the input terminal and ground; a first write boost path coupled between the input terminal and a source of supply voltage; a second write boost path coupled between the input terminal and a source of supply voltage; and a transistor coupled between the input terminal and ground.

BRIEF DESCRIPTION OF THE DRAWINGS

The invention will be better understood by reference to the following description taken in conjunction with the accompanying drawings, wherein.

DETAILED DESCRIPTION OF PREFERRED EMBODIMENTS

In a conventional SRAM memory cell, such as memory cell 100 in FIG. 1, there is a word line that activates the memory cell read/write operation, a precharge block for precharging BL/BLB after a read/write operation in response to a PRECHG signal, and write driver NMOS which is used to pull down BL/BLB during a write operation. IN/INB are data inputs and its inverted signal used to write a zero or one depending on data logic. It should be noted that the SRAM circuits in FIGS. 2-6 according to the present invention also include the IN/INB data inputs and circuitry, and the PRECHG signal and circuitry.

Figure 2:
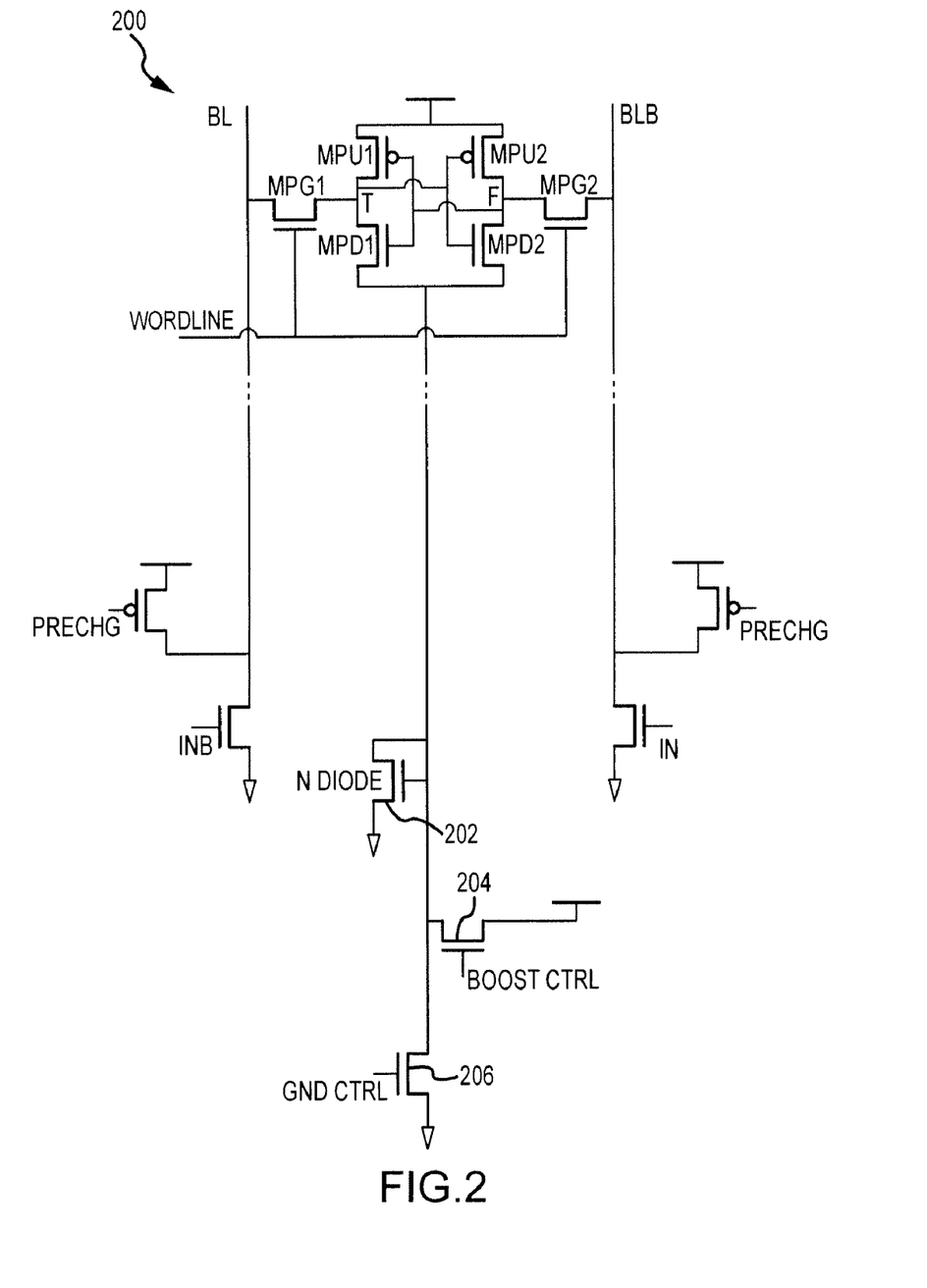
FIGS. 2-6 are schematic diagrams of SRAM circuits according to embodiments of the present invention.

Referring now to FIG. 2, an SRAM memory 200 includes a write boost circuit coupled to the ground power terminal of an SRAM cell, the write boost circuit including an N-channel diode-connected transistor 202, an N-channel transistor 204, and an N-channel transistor 206. During a write cycle, the GND CTRL Signal is set low, thus cutting off GND to the SRAM memory cell. The boost CTRL signal is then asserted high and thus the GND line of the SRAM memory cell is raised to boost writability. N-diode 202 is used to limit the voltage up to VTnmos. Writability is much poorer due to a slow NMOS pass gate and a fast fighting PMOS of the memory cell. Write boost is thus generally required at this single process corner of slow NMOS and fast PMOS and other process corners are not critical in writability. But, if write boost is applied with out taking care of the need at the single process corner, then there happens to be an unnecessary boost power consumption at all other process corners where writing is not a problem.

Figure 3:
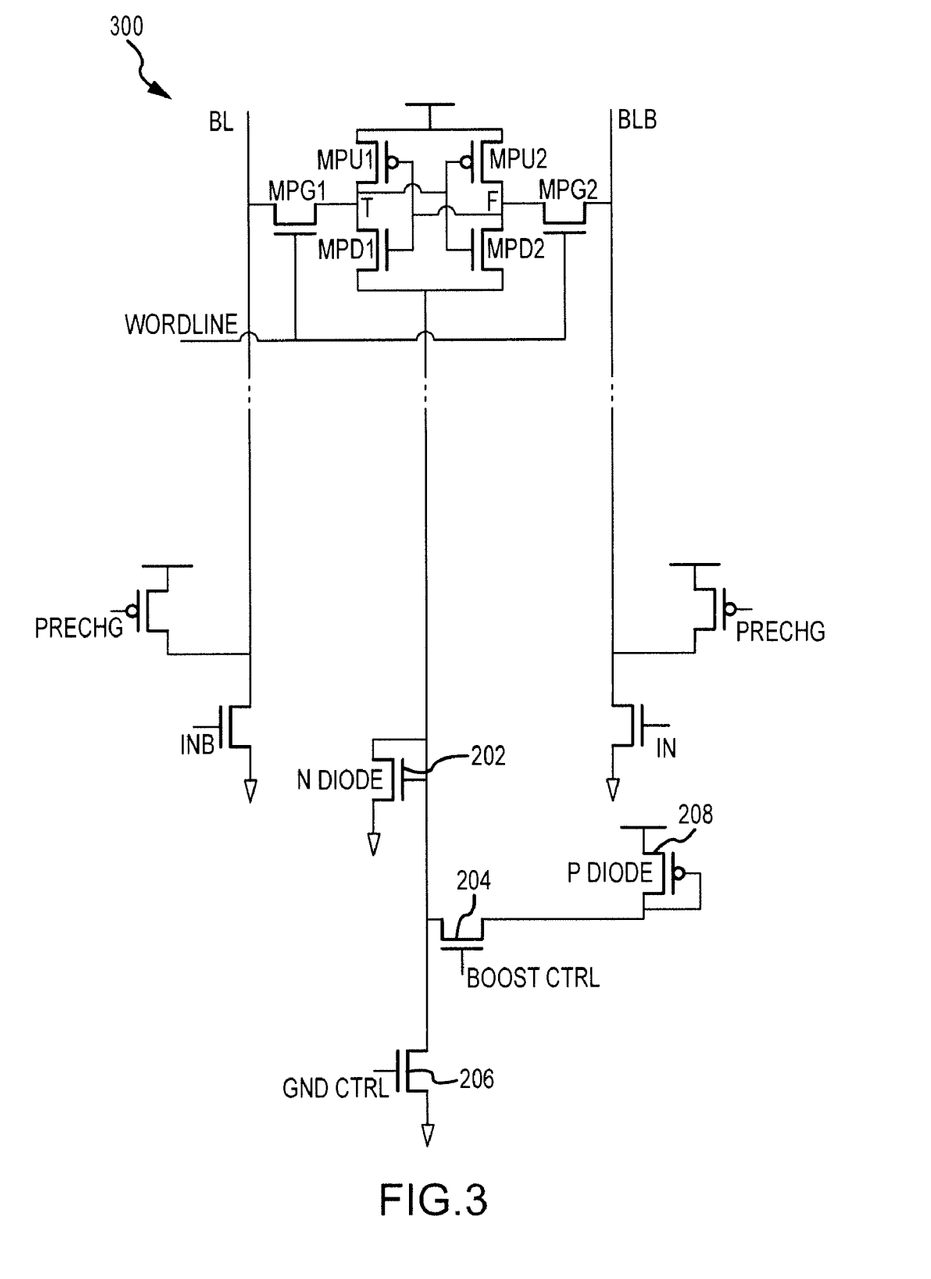

A process-controlled write boost circuit for memory 300 is shown in FIG. 3. The circuit is the same as that shown in FIG. 2, except for diode-connected P-channel transistor 208 as shown. In operation, the boost required is at slow NMOS and fast PMOS. Thus, by adding the P-diode 208 as shown in FIG. 3, the write boost circuit is tuned for a particular corner to provide sufficient rise of the GND level and at other corners the rise of the GND level is limited, thus saving boost power at non-required corners.

Figure 4:
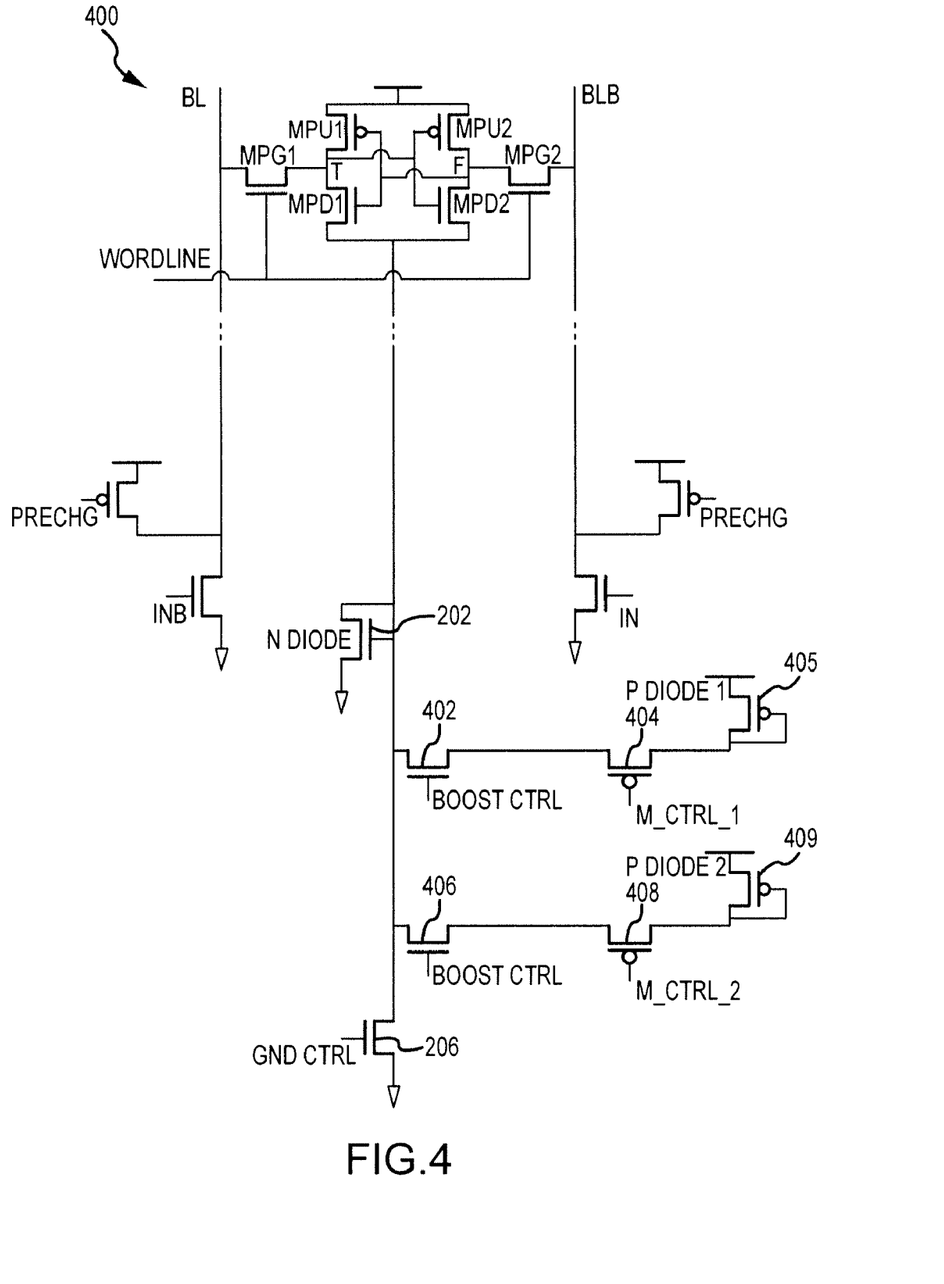

A multiple boost control circuit for memory 400 shown in FIG. 4 uses the same N-diode 202 and N-channel transistor 206. However, the write boost circuit includes a first boost path including N-channel transistor 402, P-channel transistor 404, and P-diode 405, as well as a second boost path including N-channel transistor 406, P-channel transistor 408, and P-diode 409. In FIG. 4, multiple boost modes are implemented with two paths of write boost with different sizes of devices, the two paths of write boost are controlled by the M_CTRL_1 and M_CTRL_2 control signals. Three boost levels are thus possible with this scheme shown in TABLE I below:

| Boost | M_CTRL_1 | M_CTRL_2 |
|---|---|---|
| Normal | Low | High |
| Weak | High | Low |
| Strong | Low | Low |

Thus by debug modes, the necessary GND raised level can be tuned to further optimize the boost power.

Figure 5:
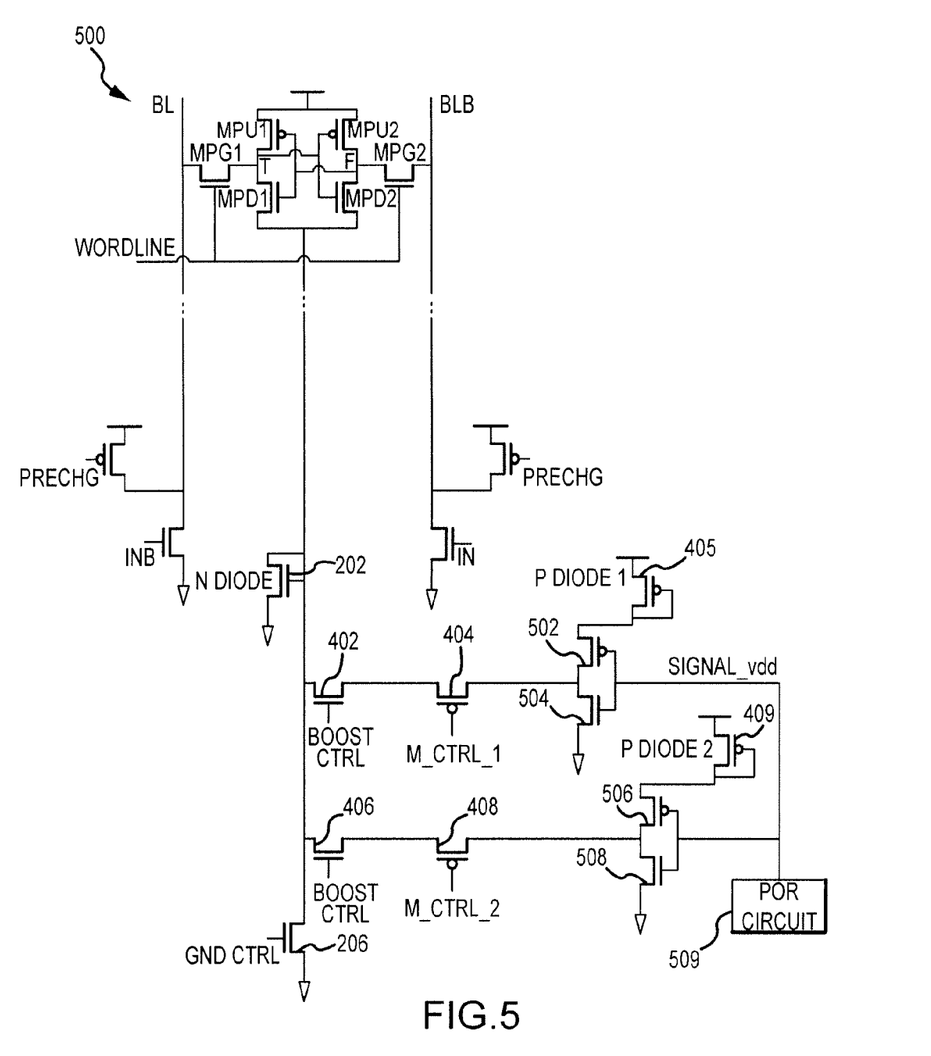

An automatic write boost enable circuit for low voltages with a POR circuit is shown in FIG. 5 for memory 500. Circuit 500 is similar to circuit 400, with the inclusion of inverter 502/504 and inverter 506/508. The inputs of both inverters are coupled to the output of POR circuit 509. Since the writability of a memory cell is an issue below a certain low power supply voltage level, at high voltage ranges the write boost is turned off. Otherwise, the dynamic power increases due to unnecessary GND level raising at higher voltages. This can be done using a dedicated external pin, which will control the write boost depending upon the logic on the external pin as controlled by the user depending upon the voltage ranges. But, in order to remove the dependency on voltage range, an automatic low voltage enable circuit like a Power On Reset ("POR") circuit is implemented to avoid any use of an external pin. Thus, at the low voltage range the signal_vdd from the POR circuit 509 is automatically set high and thus write boost is enabled and writability is improved. POR circuit 509 can be used to trigger write assist by any means, i.e. a negative bitline approach, a VDD lowering approach, or a boosted WL approach. All these schemes can be used for write assist and can be coupled with POR circuit 509, which eliminates the need of an external control. This control can be used to trigger write assist in multiple memory modules, if desired.

Figure 6:
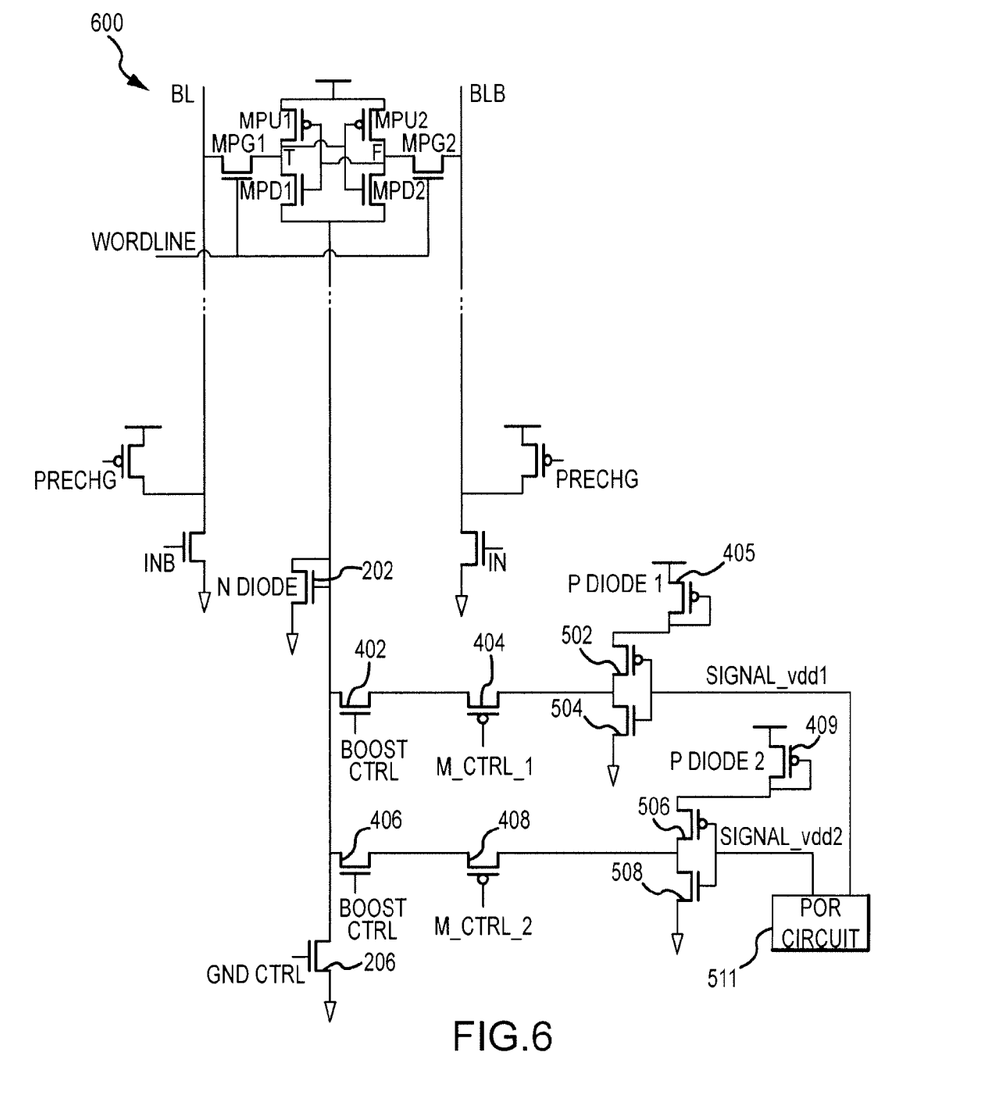

A multiple voltage range boost level circuit is shown in FIG. 6 for SRAM memory 600. The circuit shown in FIG. 6 is similar to the one shown in FIG. 5. Note, however, that in FIG. 6 the POR circuit 511 has two outputs signal_vdd1 for driving the input of inverter 502/504, and signal_vdd2 for driving the input of inverter 506/508. At different voltage ranges the boost level can be tuned by using a multiple voltage range POR circuit 511 implemented in two boost control paths with different device strengths and thus the boost power can be further reduced.

Figure 7:
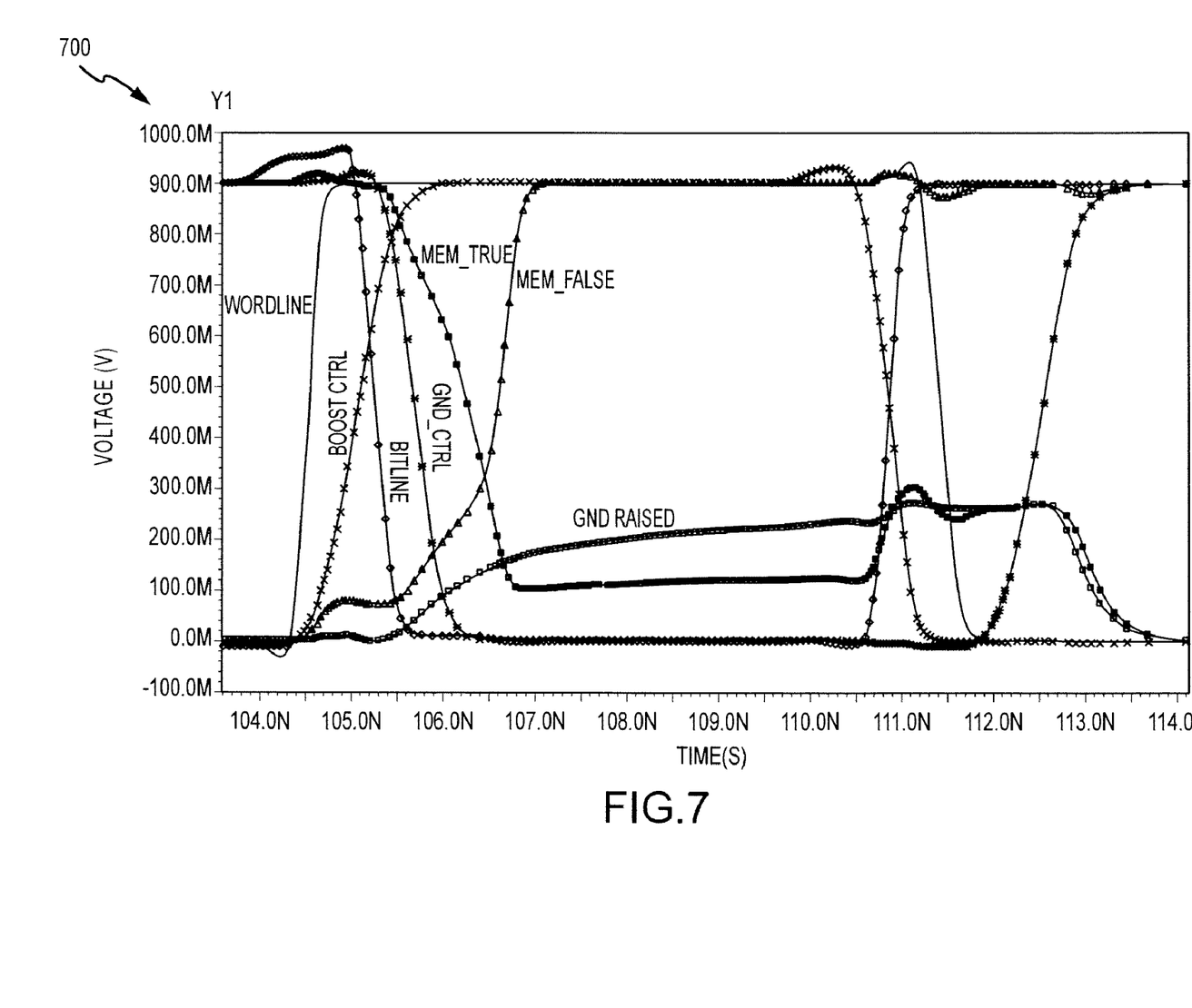
FIG. 7 is a timing diagram associated with the performance enhancement realized by the circuits of the present invention.

A simulation of the write boost circuit is shown in the timing diagram of FIG. 7, where the following circuit waveforms are used:
Wordline;
Boost_CTRL;
Bitline;
GND_CTRL;
MEM_True;
MEM_False; and
GND Raised.

As shown in FIG. 7, during the write cycle, GND_CTRL is set low and Boost_CTRL is set high to raise the memory cell GND level for writability improvement at low voltages.

The advantages of the circuit of the present invention is that chip area is increased only slightly (less than 2%), and it can be used with deep submicron SRAM memories operating with low power supply voltages. According to the present invention the write boost helps the memory cell operate at low voltage with an auto low voltage enable and is process controlled. The process controlled boost implementation uses a P-diode for saving boost power at non-required corners. Multiple control boost levels depend upon the boost need of the memory to further save the boost power. Voltage controlled boost initiation is also used to save the boost power at higher voltages.

Although an embodiment of the present invention has been described for purposes of illustration, it should be understood that various changes, modification and substitutions may be incorporated in the embodiment without departing from the spirit of the invention that is defined in the claims, which follow.

We claim:

1. A write boost circuit for an SRAM cell comprising:
   an input terminal for coupling to a power terminal of an SRAM cell;
   a diode coupled between the input terminal and ground;
   a first write boost path coupled between the input terminal and a source of supply voltage;
   a second write boost path coupled between the input terminal and the source of supply voltage; and
   a transistor coupled between the input terminal and ground, wherein the first write boost path comprises a first transistor, a second transistor, and a diode serially coupled between the input terminal and the source of supply voltage.

2. The write boost circuit of claim 1 wherein the diode coupled between the input terminal and ground comprises an N-channel diode-connected transistor.

3. The write boost circuit of claim 1 wherein the first and second write boost paths are differently sized.

4. The write boost circuit of claim 1 wherein the first transistor comprises an N-channel transistor for receiving a boost control signal, and the second transistor comprises a P-channel transistor for receiving an additional control signal.

5. The write boost circuit of claim 1 wherein the first write boost path is coupled to a first output of a power-on reset circuit.

6. The write boost circuit of claim 1 wherein the second write boost path is coupled to a second output of a power-on reset circuit.

7. A write boost circuit for an SRAM cell comprising:
   an input terminal for coupling to a power terminal of an SRAM cell;
   a diode coupled between the input terminal and ground;
   a first write boost path coupled between the input terminal and a source of supply voltage;
   a second write boost path coupled between the input terminal and the source of supply voltage; and
   a transistor coupled between the input terminal and ground, wherein the second write boost path comprises a first transistor, a second transistor, and a diode serially coupled between the input terminal and the source of supply voltage.

8. The write boost circuit of claim 7 wherein the diode coupled between the input terminal and ground comprises an N-channel diode-connected transistor.

9. The write boost circuit of claim 7 wherein the first and second write boost paths are differently sized.

10. The write boost circuit of claim 7 wherein the first transistor comprises an N-channel transistor for receiving a boost control signal, and the second transistor comprises a P-channel transistor for receiving an additional control signal.

11. The write boost circuit of claim 7 wherein the first write boost path is coupled to a first output of a power-on reset circuit.

12. The write boost circuit of claim 7 wherein the second write boost path is coupled to a second output of a power-on reset circuit.

13. A write boost circuit for an SRAM cell comprising:
   an input terminal for coupling to a power terminal of an SRAM cell;
   a diode coupled between the input terminal and ground;
   a first write boost path coupled between the input terminal and a source of supply voltage;
   a second write boost path coupled between the input terminal and the source of supply voltage; and
   a transistor coupled between the input terminal and ground, wherein the first and second write boost paths are coupled to a power-on reset circuit, and wherein the first write boost path further comprises an inverter having an input coupled to the power-on reset circuit.

14. The write boost circuit of claim 13 wherein the diode comprises an N-channel diode-connected transistor.

15. The write boost circuit of claim 13 wherein the first and second write boost paths are differently sized.

16. The write boost circuit of claim 13 wherein the first write boost path is coupled to a first output of the power-on reset circuit.

17. The write boost circuit of claim 13 wherein the second write boost path is coupled to a second output of the power-on reset circuit.

18. A write boost circuit for an SRAM cell comprising:
   an input terminal for coupling to a power terminal of an SRAM cell;
   a diode coupled between the input terminal and ground;
   a first write boost path coupled between the input terminal and a source of supply voltage;
   a second write boost path coupled between the input terminal and the source of supply voltage; and
   a transistor coupled between the input terminal and ground, wherein the first and second write boost paths are coupled to a power-on reset circuit, and wherein the second write boost path further comprises an inverter having an input coupled to the power-on reset circuit.

19. The write boost circuit of claim 18 wherein the diode comprises an N-channel diode-connected transistor.

20. The write boost circuit of claim 18 wherein the first and second write boost paths are differently sized.

21. The write boost circuit of claim 18 wherein the first write boost path is coupled to a first output of the power-on reset circuit.

22. The write boost circuit of claim 18 wherein the second write boost path is coupled to a second output of the power-on reset circuit.

* * * * *